(12) United States Patent
Okada et al.

(10) Patent No.: US 6,492,272 B1
(45) Date of Patent: Dec. 10, 2002

(54) CARRIER GAS MODIFICATION FOR USE IN PLASMA ASHING OF PHOTORESIST

(75) Inventors: Lynne A. Okada, Sunnyvale, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/805,975

(22) Filed: Mar. 15, 2001

Related U.S. Application Data
(60) Provisional application No. 60/268,698, filed on Feb. 15, 2001.

(51) Int. Cl.[7] .............................................. H01L 21/00
(52) U.S. Cl. ................... 438/690; 134/1.2; 204/192.32; 216/67; 438/725
(58) Field of Search ............................ 134/1.1, 1.2, 1.3; 216/67; 204/192.32; 438/690, 725

(56) References Cited

U.S. PATENT DOCUMENTS 4,786,359 A * 11/1988 Stark et al. ................. 438/710
5,308,791 A * 5/1994 Horiike et al. ........... 134/1.2 X

* cited by examiner

Primary Examiner—William A. Powell

(57) ABSTRACT

Deleterious physical sputtering of workpiece layers accompanying removal of photoresist layers from the workpiece by plasma ashing utilizing an active plasma ashing gas such as $O_2$, $N_2$, $N_2/O_2$, or $H_2/N_2$ gas mixtures admixed with Ar inert carrier gas/diluent, is eliminated, or at least substantially reduced, by replacing the Ar with an inert gas of greater atomic weight, such as Kr or Xe, and supplying a lower level of electrical power to the plasma reactor than when Ar is utilized.

20 Claims, 2 Drawing Sheets

CARRIER GAS MODIFICATION FOR USE IN PLASMA ASHING OF PHOTORESIST

CROSS-REFERENCE TO PROVISIONAL APPLICATION

This application claims priority from U.S. Provisional patent application Serial No. 60/268,698, filed Feb. 15, 2001, the entire disclosure of which is incorporated herein by reference.

CROSS-REFERENCE TO RELATED APPLICATION

This application contains subject matter similar to subject matter disclosed in copending U.S. patent application Ser. No. 09/805,974, filed on Mar. 15, 2002.

1. Field of the Invention

The present invention relates to improved methods for performing plasma ashing of a photoresist material. More specifically, the present invention relates to improved methods for performing plasma ashing of patterned photoresist layers subsequent to formation of openings in a dielectric layer as part of multi- metallization level processing utilized in the fabrication of high integration density, semiconductor integrated circuit (IC) devices having submicron-dimensioned design features, wherein deleterious reaction of underlying metallization features with the gas(es) utilized for plasma ashing of photoresist is advantageously eliminated, or at least substantially reduced.

2. Background of the Invention

The escalating requirements for high integration density and performance associated with ultra large-scale ("ULSI") integration semiconductor device wiring and interconnection require responsive changes in interconnection technology. Such escalating requirements have been difficult to satisfy in terms of providing a low resistance-capacitance ("RC") interconnection pattern, particularly wherein the various metallization features, e.g., vias, contacts, trenches, etc., are submicron-dimensioned and have high aspect ratios due to micro-miniaturization.

Conventional semiconductor IC devices typically comprise a semiconductor substrate, such as a monocrystalline silicon (Si) wafer including a plurality of active device regions formed thereon or therein, and a plurality of pairs of overlying, sequentially formed inter-layer dielectrics ("ILD"s) and patterned metal layers. An integrated circuit is formed therefrom containing a plurality of electrically conductive patterns comprising conductive lines separated by interwiring spaces, and a plurality of interconnect lines, such as bus lines, bit lines, word lines and logic interconnect lines. Typically, the conductive patterns of different layers, i.e., upper and lower vertically spaced-apart layers, are electrically connected by a conductive plug filling a via opening, while a conductive plug filling a contact opening establishes an electrical contact with an active device region on or in the semiconductor substrate, such as a source or drain region of a transistor. Conductive lines are formed in trenches which typically extend substantially horizontal with respect to the semiconductor substrate. Semiconductor IC devices comprising five (5) or more such levels of vertically interconnected metallization are becoming more prevalent as device geometries decrease into the deep submicron range.

A conductive plug filling a via opening is typically formed by a process sequence comprising: (1) depositing an inter-layer dielectric (ILD) on a patterned, electrically conductive layer, e.g., a metal layer comprising at least one metal feature; (2) forming a desired opening in the ILD, as by conventional photolithographic masking and etching techniques, and filling the opening with an electrically conductive material, e.g., tungsten (W); and (3) removing excess conductive material deposited on the surface of the ILD during filling of the opening, as by chemical-mechanical polishing/planarization ("CMP").

One such method for fabricating electrically conductive vias is termed "damascene" type processing and basically involves the formation of an opening in an ILD which is filled with a metal plug. "Dual-damascene" processing techniques involve formation of an opening in an ILD comprising a lower, contact or via opening section communicating with an upper, trench opening section, followed by filling of both the lower and upper sections of the opening with an electrically conductive material, typically a metal or metallic material, to simultaneously form a conductive (via) plug in electrical contact with a conductive line.

Referring now to FIGS. 1(A)–1(C), illustrated therein in schematic, cross-sectional form, are several stages of a typical photolithographic masking + etching process conventionally utilized for forming an opening in an ILD layer for use as, for example, a via, bus line, bit line, word line, or interconnection line in metallization processing of semiconductor IC devices, e.g., according to the above-described damascene-type techniques.

Referring particularly to FIG. 1, precursor structure 1 is of conventional structure and includes a lower metal feature 11, e.g., of copper (Cu) or a Cu-based alloy, in-laid within a first, or lower, ILD layer 10 overlying a substrate (not shown in the figure for illustrative simplicity), typically a monocrystalline Si wafer. Precursor structure 1 further comprises a thin nitride layer 14, typically a silicon nitride ($Si_xN_y$) layer from about 300–1000 Å thick, e.g., about 500 Å thick, formed, as by conventional techniques, to overlie the ILD layer 10 and its in-laid metal feature 11. Second, or upper ILD layer 12 is formed, as by conventional deposition techniques, to overlie the thin nitride layer 14. In this context, portion 14' of thin nitride layer 14 overlying metal feature 11 serves both as an etch stop layer during patterning of the second, upper ILD layer 12 to form a desired opening 15 therein as part of the metallization process, and as a protective layer for preventing deleterious reaction of the metal feature 11, e.g., oxidation, nitridation, etc., during processing antecedent to filling the opening with a metal material, e.g., during reactive plasma etching of the second, upper ILD layer 12 to form opening 15. Organic-based photoresist layer 13 formed over the second, upper ILD layer 12 and patterned by conventional photolithographic masking and etching techniques serves as an etch mask during the reactive plasma etching.

Adverting to FIG. 1(B), subsequent to formation of opening 15 in second, upper ILD layer 12, according to conventional processing methodology, the patterned photoresist mask is then removed by means of a plasma ashing process, typically utilizing an oxygen ($O_2$) or nitrogen ($N_2$)-based plasma (or a mixed $O_2/N_2$ or $N_2/H_2$ plasma) with admixed argon (Ar) gas functioning as an inert carrier gas/diluent for the $O_2$, $N_2$, $O_2/N_2$, or $N_2/H_2$.

As utilized herein, the term "plasma ashing" designates plasma processes for removing organic-based photoresists, e.g., subsequent to their use as etch masks, etc. By way of illustration only, a typical $O_2$-based plasma ashing reaction is conducted (in a suitable reactor) between a carbon (C)- and hydrogen (H)-containing photoresist material generally designated by the formula $C_xH_y$, and plasma-activated oxygen species, generally designated as $O^*$. according to the following equation, in which each of the reaction products is volatile and thus readily removed from the reactor chamber:

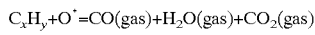
$$C_xH_y + O^* = CO(gas) + H_2O(gas) + CO_2(gas)$$

The plasma ashing process is conducted within the interior space of a suitably configured reactor with radio frequency (RF) or microwave ($\mu$wave) energization at an applied power density determined in view of a number of process/apparatus parameters, including, inter alia, the reactor size, particular ashing gas or gases, their flow rate(s) and pressure(s), photoresist composition, desired ashing rate, substrate temperature, etc. As a consequence of the plurality of process variables/parameters, the power level applied to the reactor typically is optimized for use in a particular situation/application.

As indicated above, the active plasma ashing gases, e.g., $O_2$, $N_2$, $O_2/N_2$, or $N_2/H_2$ mixtures, are frequently supplied to the interior space of the plasma reactor admixed with inert argon (Ar) gas as a carrier gas/diluent, in order to facilitate plasma formation and moderate the plasma ashing reaction. However, as indicated in FIG. 1(B), argon ions ($Ar^+$) generated in the ashing plasma bombard the exposed surfaces of the precursor structure 1 to sputter etch the exposed surfaces thereof at various etching rates, depending upon the particular material. However, inasmuch as the portion of the nitride etch stop/protective layer 14 exposed at the bottom of opening 15 is initially very thin, typically only about 500 Å thick, any loss of thickness thereof arising from sputter etching by $Ar^+$ ions during plasma ashing of the photoresist layer 13 for removal thereof, is problematic from the viewpoint of the requirement for maintaining the integrity and continuity of the thin nitride layer 14 prior to its desired removal immediately before opening 15 is filled with a metal, as in via formation.

Referring now to FIG. 1(C) illustrating the state of precursor structure 1 after completion of plasma ashing processing for removal of the photoresist layer 13, it is evident that a significant fraction of the thickness of the thin nitride layer 14 has been removed during the course of the plasma ashing due to physical sputter etching by bombardment of the workpiece by $Ar^+$ ions generated in the plasma, thereby reducing its integrity and protective (e.g., oxidation preventive) characteristics. Further, in some instances, for example as indicated in the figure by reference numeral 16, removal of the thin nitride layer 14 is sufficiently complete as to expose portions of the upper surface of the underlying metallization feature 11, and, in extreme instances, expose the entire upper surface thereof. As a consequence, at least portions of the upper surface of the metallization feature 11 are subject to deleterious reaction with the active plasma gases during the plasma ashing, such as $O_2$, $N_2$, $O_2/N_2$, or $N_2/H_2$ mixtures, whereby the upper surface of the metallization feature 11 is oxidized, nitrided, or oxynitrided to form a high resistance surface layer inimical to good electrical contact formation/adhesion with the metal material which subsequently fills the opening 15.

Accordingly, there exists a need for improved methodology for performing simple, reliable, rapid, and cost-effective plasma ashing processing of photoresists for removal thereof subsequent to their use as etch masks, which methodology effectively avoids the drawbacks and disadvantages associate with conventional techniques and provides, inter alia, no or at least a substantially reduced amount of disadvantageous, deleterious physical sputtering of the workpiece.

The present invention, wherein deleterious physical sputtering of a workpiece during removal of a photoresist therefrom by plasma ashing is eliminated, or at least substantially reduced, in which: (1) argon (Ar) gas as the inert carrier gas/diluent for the $O_2$, $N_2$, $O_2/N_2$, $N_2/H_2$ active plasma ashing gas or gases is replaced with an inert carrier gas/diluent having an atomic weight greater than that of Ar, such as krypton (Kr) and xenon (Xe); and (2) the electrical power supplied to the plasma reactor is less than that supplied to the plasma reactor when Ar is utilized, effectively addresses and solves the need for improved methodology for use in removal of photoresist materials by means of plasma ashing, particularly in the manufacture of multi-level metallization semiconductor integrated circuit devices. Further, the methodology provided by the present invention can be easily implemented in a cost-effective manner utilizing conventional plasma reactor apparatus. Finally, the methodology afforded by the instant invention enjoys diverse utility in the manufacture of numerous and various types of semiconductor devices and/or components.

DISCLOSURE OF THE INVENTION

An advantage of the present invention is an improved method for removing photoresist layers from a workpiece surface by means of plasma ashing.

Another advantage of the present invention is an improved method for performing plasma ashing of photoresist layers on a workpiece surface which incurs no, or at least substantially reduced, damage to the workpiece arising from sputter etching by ionized species of the carrier/diluent gas for the active plasma ashing gas.

Still another advantage of the present invention is an improved method for performing plasma ashing of photoresist layers as part of a process sequence for forming openings in a dielectric layer as part of a process for fabricating a semiconductor device including in-laid metallization.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of removing a photoresist layer from a workpiece by means of plasma ashing, comprising the steps of:

(a) providing the interior space of a plasma reactor with a workpiece including at least one layer of a photoresist material on a surface thereof;

(b) supplying the interior space of the reactor with a gas mixture comprising a plasma ashing gas and a carrier gas/diluent for the plasma ashing gas, the carrier gas/diluent comprising an inert gas having an atomic weight greater than that of argon (Ar); and (c) removing the at least one layer of photoresist material from the workpiece surface by generating a plasma comprising the plasma ashing gas and the carrier gas/diluent within the interior space of the reactor by supplying electrical power thereto at a level which is less than that supplied to the reactor when utilizing Ar gas as a carrier gas/diluent for the plasma ashing gas, whereby deleterious sputter etching of the workpiece resulting from bombardment of the workpiece by the ionized carrier gas/diluent of the plasma is eliminated, or at least substantially reduced, relative to when Ar gas is utilized as the carrier gas/diluent.

According to embodiments of the present invention, step (b) comprises supplying the interior space of the reactor with an oxygen/krypton ($O_2$/Kr) gas mixture, an oxygen/xenon ($O_2$/Xe) gas mixture, a nitrogen/krypton ($N_2$/Kr) gas mixture, an oxygen/nitrogen/krypton ($O_2$/$N_2$/Kr) gas mixture, a nitrogen/hydrogen/krypton ($N_2$/$H_2$/Kr) gas mixture, a nitrogen/xenon ($N_2$/Xe) gas mixture, an oxygen/nitrogen/xenon ($O_2$/$N_2$/Xe) gas mixture, or a nitrogen/hydrogen/xenon ($N_2$/$H_2$/Xe) gas mixture; and step (c) comprises supplying the interior space of the reactor with RF or microwave ($\mu$wave) electrical power.

In accordance with embodiments of the present invention, step (a) comprises providing a workpiece including at least one opening extending through a dielectric layer overlying a semiconductor substrate, the opening including a bottom and formed by an etching process utilizing the at least one layer of photoresist material as an etch mask.

According to particular embodiments of the present invention, step (a) comprises providing a workpiece wherein the bottom of the at least one opening overlies at least a portion of a metal feature of the workpiece, with a thin layer of a protective material overlying at least the surface of the metal feature at the bottom of the opening; and step (c) comprises eliminating, or at least substantially reducing, sputter etching of the thin, protective layer at the bottom of the opening arising from bombardment by ions of the carrier/inert gas, thereby maintaining protection of the underlying metal feature from reaction with the plasma ashing gas during the plasma ashing of the photoresist layer.

According to alternate embodiments of the present invention, step (a) comprises providing a workpiece wherein the at least one opening in the dielectric layer comprises an opening for forming an in-laid metallization feature utilizing single- or dual-damascene processing.

In accordance with particular embodiments of the present invention, step (a) comprises providing a workpiece wherein the at least one metal feature comprises copper (Cu) or a Cu-based alloy and the thin layer of protective material comprises a nitride.

According to another aspect of the present invention, a method of manufacturing a semiconductor device comprises the sequential steps of:
  (a) providing a workpiece comprising:
    (i) a semiconductor substrate having a surface;
    (ii) a first dielectric layer overlying the substrate surface,
    (iii) at least one metal feature in-laid in the surface of the dielectric layer;
    (iv) a thin, protective/etch stop layer overlying the at least one in-laid metal feature and the first dielectric layer; and
    (v) a second dielectric layer overlying the thin, protective/etch stop layer;
  (b) forming a layer of a photoresist material over the surface of the second dielectric layer;
  (c) patterning the layer of photoresist material to define at least one opening therein at least partly overlying the at least one metal feature;
  (d) forming an opening extending through the second dielectric layer to the thin, protective/etch stop layer by an etching process utilizing the patterned layer of photoresist material as an etch mask, the opening comprising a bottom surface formed by the thin, protective/etch stop layer; and
  (e) removing the patterned layer of photoresist material from the surface of the second dielectric layer by a plasma ashing process, comprising:
    (i) installing the etched workpiece within the interior space of a plasma reactor;
    (ii) supplying the interior space of the reactor with a gas mixture comprising a plasma ashing gas and a carrier gas/diluent for the plasma ashing gas, the carrier gas/diluent comprising an inert gas having an atomic weight greater than that of argon (Ar); and
    (iii) removing the patterned layer of photoresist material from the surface of the second dielectric layer by generating a plasma comprising the plasma ashing gas and the carrier gas/diluent within the interior space of the reactor by supplying electrical power thereto at a level less than that supplied to the reactor when utilizing Ar gas as a carrier gas/diluent for the plasma ashing gas, whereby deleterious sputter etching of the protective/etch stop layer forming the bottom surface of the opening in the second dielectric layer is eliminated, or at least substantially reduced, relative to when Ar gas is utilized as the carrier gas/diluent, thereby maintaining protection of the at least one in-laid metal feature from reaction with the plasma ashing gas during the plasma ashing of the patterned layer of photoresist material.

According to embodiments of the present invention, step (a) comprises providing a workpiece wherein the at least one in-laid metal feature comprises copper (Cu) or a Cu-based alloy and the thin, protective/etch stop layer comprises a nitride.

In accordance with embodiments of the present invention, step (e)(ii) comprises supplying said interior space of said reactor with an oxygen/krypton ($O_2$/Kr) gas mixture, an oxygen/xenon ($O_2$/Xe) gas mixture, a nitrogen/krypton ($N_2$/Kr) gas mixture, an oxygen/nitrogen/krypton ($O_2$/$N_2$/Kr) gas mixture, a nitrogen/hydrogen/krypton ($N_2$/$H_2$/Kr) gas mixture, a nitrogen/xenon ($N_2$/Xe) gas mixture, an oxygen/nitrogen/xenon ($O_2$/$N_2$/Xe) gas mixture, or a nitrogen/hydrogen/xenon ($N_2$/$H_2$/Xe) gas mixture; and step (e)(iii) comprises supplying said interior space of said reactor with RF or microwave ($\mu$wave) electrical power.

According to particular embodiments of the present invention, step (d) comprises forming an opening extending through the second dielectric layer for forming an in-laid metallization feature utilizing single- or dual-damascene processing.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that deleterious physical sputtering of a workpiece (or a layer on a surface of the workpiece) which frequently occurs during removal of a photoresist layer therefrom by plasma ashing utilizing an active plasma ashing gas and Ar gas as an inert carrier gas/diluent for the active plasma gas can be avoided, or substantially reduced. A key feature, i.e., advantage, of the present invention when utilized as part of the "back-end" metallization processing of multi-level semiconductor IC devices is the substantial elimination of undesired reaction, e.g., oxidation, of metal features of a lower metallization level prior to formation of an upper metallization level or via plug in electrical contact therewith. According to the invention, oxidation, nitridation, etc., of a metal layer at the bottom of an opening formed in an inter-layer dielectric (ILD) is eliminated, or at least substantially reduced, during plasma ashing processing for removal of a photoresist layer utilized for forming the opening, by (1) replacing the Ar carrier/diluent gas with an inert gas of greater atomic weight, e.g., Kr or Xe; and (2) applying a level of electrical power to the plasma reactor which is less than the power applied to the reactor when Ar is utilized, whereby deleterious physical sputtering of a thin layer of a protective layer overlying the metal layer at the bottom of the opening is avoided. As a consequence of the inventive methodology, high-quality, multi-metallization level semiconductor IC devices can be readily and cost-effectively fabricated utilizing otherwise conventional methodologies and instrumentalities. Further, the inventive methodology is applicable to all manner of plasma ashing processes for removal of photoresist layers from workpiece surfaces.

Figure 2A:
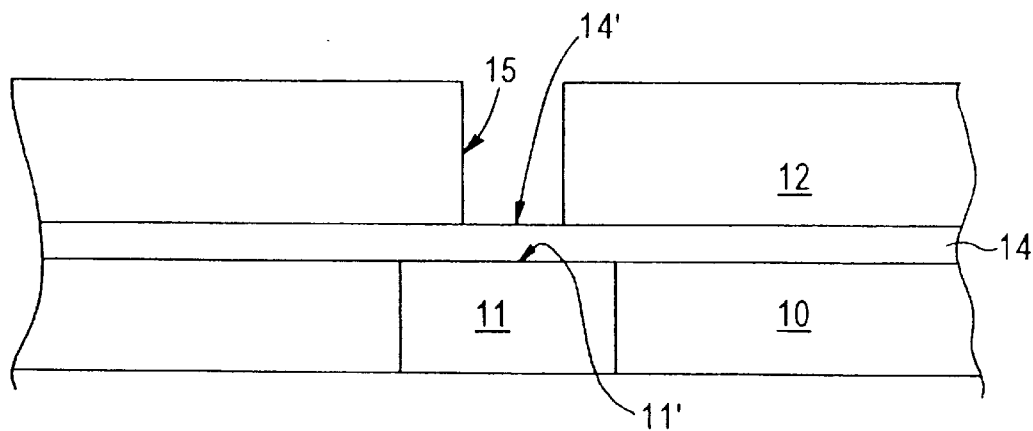
FIG. 2(A) illustrates, in simplified, cross-sectional schematic form, the advantageous result of removing a photoresist by a plasma ashing process according to the present invention FIG. 2(B) schematically illustrates applications of an embodiment of the present invention to dual damascene processing.

More specifically, as is evident from FIG. 2(A), according to the inventive methodology described supra, removal of a carbon-containing photoresist layer 13 by plasma ashing advantageously incurs little or no concomitant physical sputtering of the portion 14' of the thin, protective nitride layer 14 exposed at the bottom of opening 15 formed in the second, or upper ILD layer 12. As a consequence, the integrity and quality, i.e., continuity and defect-free nature of nitride layer portion 14' is maintained, and as a further consequence, the portion 11' of metal layer 11 underlying nitride layer 14 incurs no deleterious reaction with the gases utilized for the plasma ashing process which can (upon removal of the nitride layer portion 14') adversely affect electrical contact with and/or adhesion to a metal layer or via plug, as of tungsten (W), subsequently formed to fill opening 15.

The methodology of the present invention is applicable to a plasma ashing processing for removal of a wide variety of organic-based photoresists, such as, but not limited to, Shipley UV 210™ and UV 110™, and Sumitomo AX 655™, and to a variety of semiconductor processing applications/sequences wherein deleterious physical sputtering of the workpiece and/or various constituent layers thereof must be avoided or at least minimized. For example, the present invention may be utilized in metallization processing utilizing dual-damascene techniques for plasma ashing of photoresist layers utilized in forming openings in ILD layers. Referring to FIG. 2(B), a dual-damascene workpiece 2 comprises an underlying metal feature 21 formed in a first, or lower ILD layer 20 overlying a semiconductor substrate (not shown for illustrative simplicity), e.g., a monocrystalline Si wafer, a thin nitride layer 14, analogous to nitride layer 14 of FIG. 1 and functioning as an etch stop/protective layer for the underlying metal feature 21, and a second, or upper ILD layer 22 having a dual damascene opening 24 comprising an upper, wider portion 24U and a lower, narrower portion 24L formed therein. Opening 24 in upper ILD layer 22 is formed by conventional photolithographic patterning and etching techniques utilizing a patterned photoresist layer similar to photoresist layer 13 utilized in forming the single-damascene opening of FIG. 1, which photoresist layer is removed by plasma ashing according to the invention. The resultant structure shown is shown in FIG. 2(B), wherein it is apparent that little or no deleterious physical sputtering of the thin nitride layer occurs when an inert carrier gas/diluent having a higher atomic weight than Ar is utilized and the plasma power is maintained at a level less than that utilized with Ar.

EXAMPLE

Figure 1A:
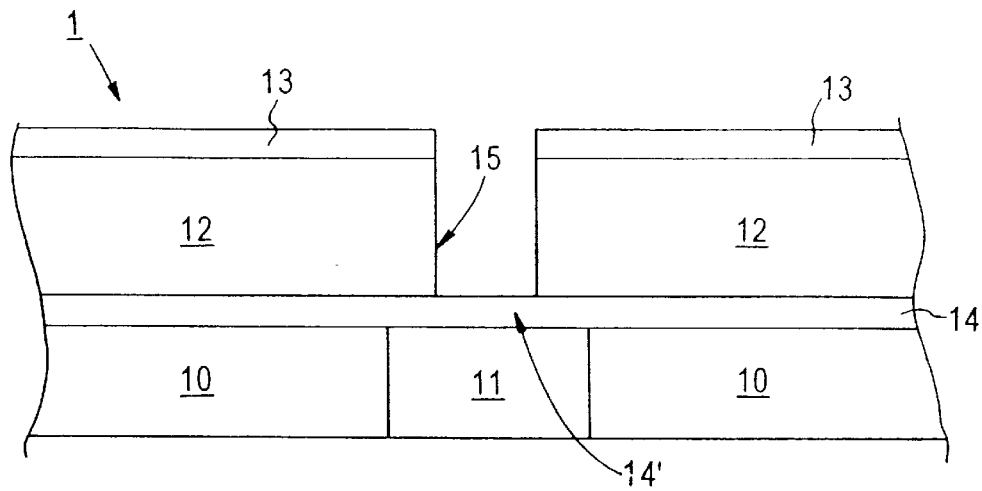
FIGS. 1(A)–1(C) illustrate, in simplified, cross-sectional schematic form, stages in a process for removal of a photoresist according to conventional methodology for performing plasma ashing.
Figure 1B:
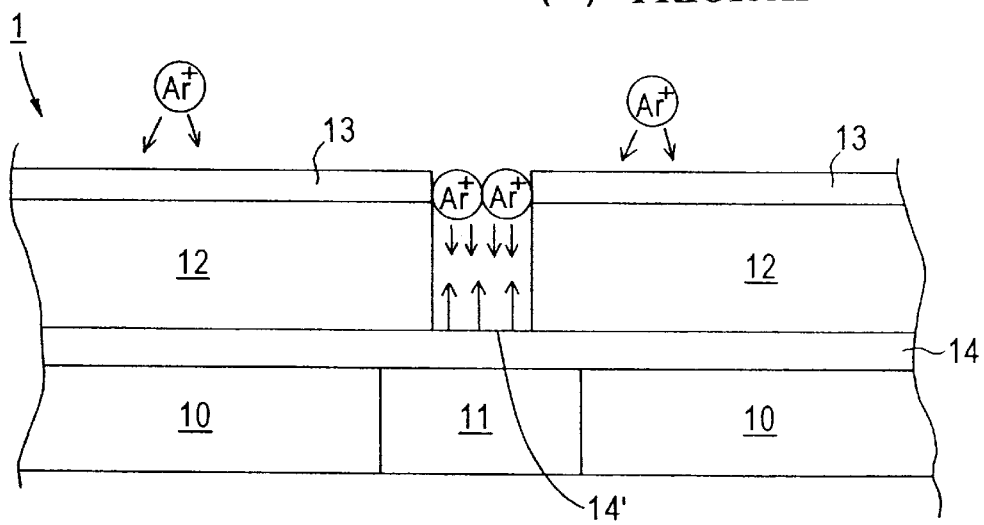
Figure 1C:
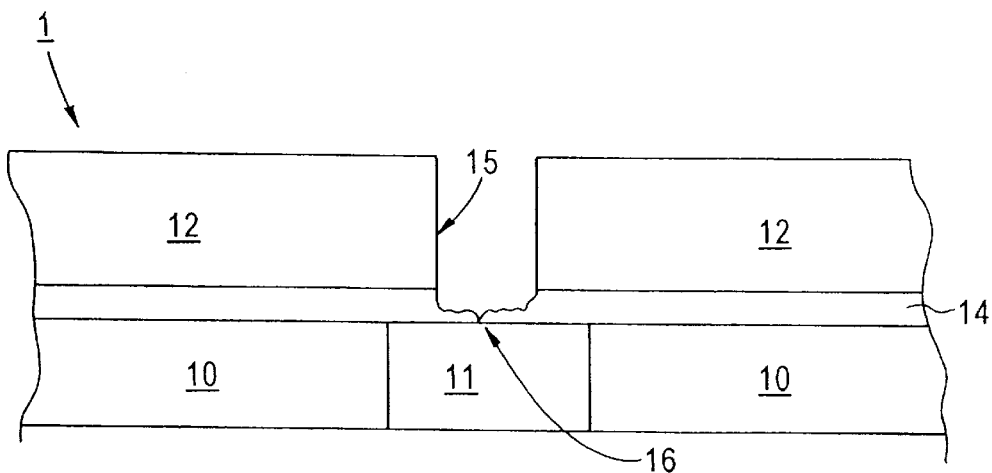
Figure 2B:
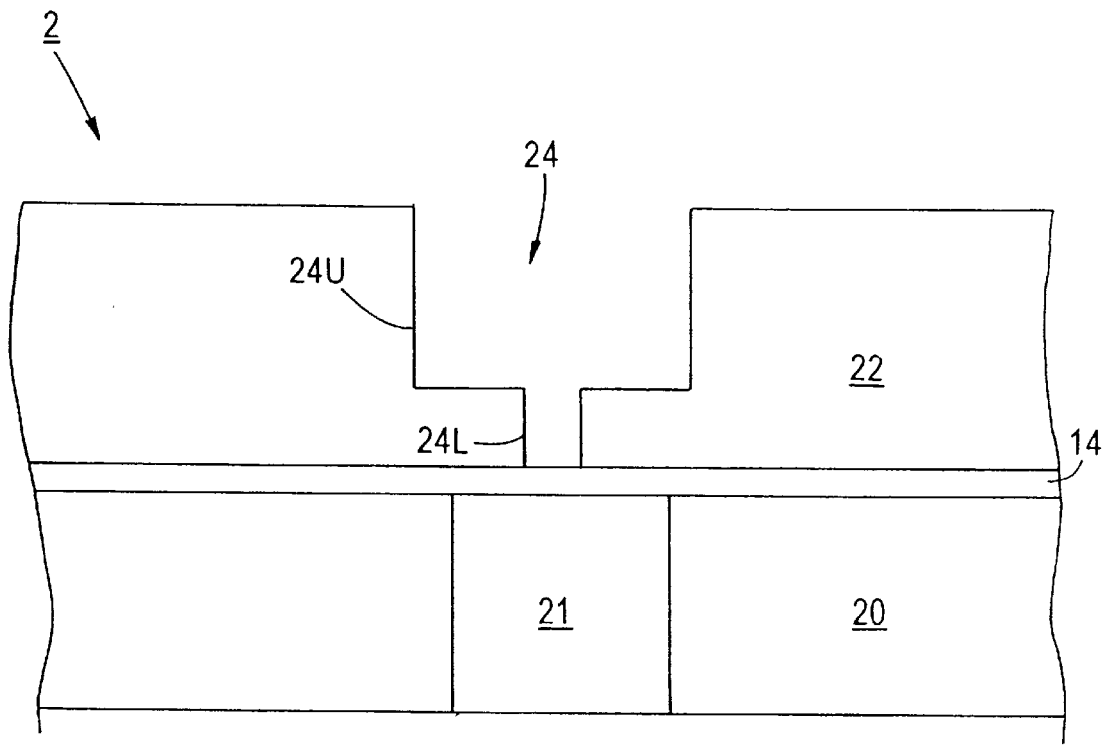

Single-damascene type workpieces 1, such as illustrated in FIG. 1(A), and comprising a Cu metal feature 11, a thin silicon nitride etch stop/protective layer 14 about 500 Å thick, and an about 3,000–6,000 Å thick photoresist layer 13 (Shipley UV 110™) were placed in a medium density plasma reactor for removal of the photoresist by plasma ashing utilizing various mixtures of active plasma gas(es) and inert carrier gas/diluent, i.e., $O_2$/inert gas; $N_2$/inert gas, $O_2/N_2$/inert gas mixtures, and $N_2/H_2$/inert gas mixture. In each case, the gas mixture comprised about 50–90 vol. % active plasma gas and about 50–10 vol. % inert gas, the gas mixture was supplied to the reactor at a flow rate of about 200–800 sccm, and the reactor pressure was maintained at about 5–1,000 mTorr. Plasma ashing of the photoresist layer was conducted at stripping rates of about 2,000–8,000 Å/min. by means of a plasma generated by application of about 200–500 W of 13.56 MHz RF power to the reactor. In each instance wherein Ar was utilized as the inert carrier gas/diluent, thickness reduction and pinhole formation of the thin nitride etch stop/protective layer 14 was observed due to physical sputtering thereof; whereas, when Kr or Xe was utilized as the inert carrier gas/diluent, thickness reduction or pinhole formation of the etch stop/protective layer 14 was reduced. Moreover, when Kr or Xe were utilized as the inert carrier gas/diluent during plasma ashing of the photoresist 13, subsequent exposure of the Cu layer 11 by removal of the overlying portion 14' of the thin nitride layer 14 and filling of the opening 15 with a metal, e.g., W, resulted in lower resistance, more adherent electrical contacts than when Ar was utilized.

While the exact mechanism for the observed differences in behavior between ashing plasmas containing Ar as inert carrier gas/diluent and plasmas containing Kr or Xe is not known with certainty, and not desirous of being bound by any particular theory, it is nonetheless believed that the elimination or substantial reduction in undesired physical sputtering of the workpiece surfaces associated with the use of such higher atomic weight inert gases (e.g., Kr and Xe) vis-a-vis Ar is largely attributable to the reduced velocity at which the heavier ions of the former gases bombard the workpiece surfaces, for a given level of plasma power applied to the reactor. Stated somewhat differently, for substantially the same level of plasma generation power applied to the reactor under the same or similar conditions, a greater proportion of the heavier atomic weight inert gases (Kr or Xe) are ionized than is the case with the lighter Ar atoms. However, as a consequence of their heavier atomic weights, the Kr and Xe ions generated in the plasma are not accelerated to velocities comparable to those of the lighter Ar ions for the same applied power, and thus they bombard the workpiece surfaces at significant lower energies. This, in turn, leads to a reduced amount of unwanted physical sputtering thereof when Kr or Xe is substituted for Ar.

The inventive method provides a number of benefits, including maintenance of the critical dimension (CD) during patterning. As a consequence, high quality, accurately dimensioned, low resistance electrical contacts, interconnections, and metallization patterns for use in semiconductor IC devices may be advantageously formed in a rapid, cost-effective manner utilizing conventional manufacturing apparatus and instrumentalities. In addition, the inventive methodology enjoys utility in the manufacture of various other electrical and electronic devices and components wherein photoresist layers must be removed by plasma ashing without incurring loss or damage to various workpiece surfaces and constituent layers, as by physical sputtering thereof, e.g., as in circuit board manufacture. Finally, the invention can be practiced at rates consistent with the throughput requirements of automated manufacturing processes and is fully compatible with conventional process flow for the manufacture of semiconductor IC devices and components.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed is:

1. A method of removing a photoresist layer from a workpiece by means of plasma ashing, comprising the steps of:
   (a) providing the interior space of a plasma reactor with a workpiece including at least one layer of a photoresist material on a surface thereof;
   (b) supplying said interior space of said reactor with a gas mixture comprising a plasma ashing gas and a carrier gas/diluent for said plasma ashing gas, said carrier gas/diluent comprising an inert gas having an atomic weight greater than that of argon (Ar); and
   (c) removing said at least one layer of photoresist material from said workpiece surface by generating a plasma comprising said plasma ashing gas and said carrier gas/diluent within said interior space of said reactor by supplying electrical power thereto a level less than that supplied to said reactor when utilizing Ar gas as a said carrier gas/diluent for said plasma ashing gas, whereby deleterious sputter etching of said workpiece resulting from bombardment of said workpiece by ions of said carrier gas/diluent formed in said plasma is eliminated, or at least substantially reduced, relative to when Ar gas is utilized as said carrier gas/diluent.

2. The method as in claim 1, wherein:
   step (b) comprises supplying said interior space of said reactor with an oxygen/krypton ($O_2$/Kr) gas mixture.

3. The method as in claim 1, wherein:
   step (b) comprises supplying said interior space of said reactor with an oxygen/xenon ($O_2$/Xe) gas mixture.

4. The method as in claim 1, wherein:
   step (b) comprises supplying said interior space of said reactor with a nitrogen/krypton ($N_2$/Kr) gas mixture, an oxygen/nitrogen/krypton ($O_2$/$N_2$/Kr) gas mixture, or a nitrogen/hydrogen/krypton ($N_2$/$H_2$/Kr) gas mixture.

5. The method as in claim 1, wherein:
   step (b) comprises supplying said interior space of said reactor with a nitrogen/xenon ($N_2$/Xe) gas mixture, an oxygen/nitrogen/xenon ($O_2$/$N_2$/Xe) gas mixture, or a nitrogen/hydrogen/xenon ($N_2$/$H_2$/Xe) gas mixture.

6. The method as in claim 1, wherein:
   step (c) comprises supplying said interior space of said reactor with RF electrical power.

7. The method as in claim 1, wherein:
   step (c) comprises supplying said interior space of said reactor with microwave ($\mu$wave) electrical power.

8. The method as in claim 1, wherein:
   step (a) comprises providing a workpiece including at least one opening extending through a dielectric layer overlying a semiconductor substrate, said opening including a bottom and formed by an etching process utilizing said at least one layer of photoresist material as an etch mask.

9. The method as in claim 8, wherein:
   step (a) comprises providing a said workpiece wherein said bottom of said at least one opening overlies at least a portion of a metal feature of said workpiece, with a thin layer of a protective material overlying at least the surface of said metal feature at said bottom of said opening; and
   step (c) comprises eliminating, or at least substantially reducing, sputter etching of said thin, protective layer at said bottom of said opening arising from bombardment by ions of said carrier/inert gas, thereby maintaining protection of the underlying metal feature from reaction with said plasma ashing gas during said plasma ashing of said photoresist layer.

10. The method as in claim 9, wherein:
    step (a) comprises providing a said workpiece wherein said at least one opening in said dielectric layer comprises an opening for forming an in-laid metallization feature utilizing single- or dual-damascene processing.

11. The method as in claim 9, wherein:
    step (a) comprises providing a said workpiece wherein said at least one metal feature comprises copper (Cu) or a Cu-based alloy and said thin layer of protective material comprises a nitride.

12. A method of manufacturing a semiconductor device, comprising the sequential steps of:
    (a) providing a workpiece comprising:
        (i) a semiconductor substrate having a surface;
        (ii) a first dielectric layer overlying said substrate surface;
        (iii) at least one metal feature in-laid in the surface of said dielectric layer;

(iv) a thin, protective/etch stop layer overlying said at least one in-laid metal feature and said first dielectric layer; and (v) a second dielectric layer overlying said thin, protective/etch stop layer;

(b) forming a layer of a photoresist material over the surface of said second dielectric layer;

(c) patterning said layer of photoresist material to define at least one opening therein at least partly overlying said at least one metal feature;

(d) forming an opening extending through said second dielectric layer to said thin, protective/etch stop layer by an etching process utilizing said patterned layer of photoresist material as an etch mask, said opening comprising a bottom surface formed by said thin, protective/etch stop layer; and (e) removing said patterned layer of photoresist material from said surface of said second dielectric layer by a plasma ashing process, comprising:

(i) installing the etched workpiece within the interior space of a plasma reactor;

(ii) supplying said interior space of said reactor with a gas mixture comprising a plasma ashing gas and a carrier gas/diluent for said plasma ashing gas, said carrier gas/diluent comprising an inert gas having an atomic weight greater than that of argon (Ar); and (iii) removing said patterned layer of photoresist material from said surface of said second dielectric layer by generating a plasma comprising said plasma ashing gas and said carrier gas/diluent within said interior space of said reactor by supplying electrical power thereto at a level less than that supplied to said reactor when utilizing Ar gas as a said carrier gas/diluent for said plasma ashing gas, whereby deleterious sputter etching of said protective/etch stop layer forming said bottom surface of said opening in said second dielectric layer is eliminated, or at least substantially reduced, relative to when Ar gas is utilized as said carrier gas/diluent, thereby maintaining protection of said at least one in-laid metal feature from reaction with said plasma ashing gas during said plasma ashing of said patterned layer of photoresist material.

13. The method as in claim 12, wherein:

step (a) comprises providing a workpiece wherein said at least one in-laid metal feature comprises copper (Cu) or a Cu-based alloy and said thin, protective/etch stop layer comprises a nitride.

14. The method as in claim 12, wherein:

step (e)(ii) comprises supplying said interior space of said reactor with an oxygen/krypton ($O_2$/Kr) gas mixture.

15. The method as in claim 12, wherein:

step (e)(ii) comprises supplying said interior space of said reactor with an oxygen/xenon ($O_2$/Xe) gas mixture.

16. The method as in claim 12, wherein:

step (e)(ii) comprises supplying said interior space of said reactor with a nitrogen/krypton ($N_2$/Kr) gas mixture, an oxygen/nitrogen/krypton ($O_2$/$N_2$/Kr) gas mixture, or a nitrogen/hydrogen/krypton ($N_2$/$H_2$/Kr) gas mixture.

17. The method as in claim 12, wherein:

step (e)(ii) comprises supplying said interior space of said reactor with a nitrogen/xenon ($N_2$/Xe) gas mixture, an oxygen/nitrogen/xenon ($O_2$/$N_2$/Xe) gas mixture, or a nitrogen/hydrogen/xenon ($N_2$/$H_2$/Xe) gas mixture.

18. The method as in claim 12, wherein:

step (e)(iii) comprises supplying said interior space of said reactor with RF electrical power.

19. The method as in claim 12, wherein:

step (e)(iii) comprises supplying said interior space of said reactor with microwave ($\mu$wave) electrical power.

20. The method as in claim 12, wherein:

step (d) comprises forming an opening extending through said second dielectric layer for forming an in-laid metallization feature utilizing single- or dual-damascene processing.

* * * * *

UNITED STATES PATENT AND TRADEMARK OFFICE
CERTIFICATE OF CORRECTION

PATENT NO. : 6,492,272 B1
DATED : December 10, 2002
INVENTOR(S) : Lynne A. Okada et al.

It is certified that error appears in the above-identified patent and that said Letters Patent is hereby corrected as shown below:

<u>Title page,</u>
Item [*] Notice, should read as follows:
-- [*] Notice: Subject to any disclaimer, the term of this patent is extended or adjusted under 35 U.S.C. 154(b) by 0 days. --.

Signed and Sealed this

Thirtieth Day of March, 2004

JON W. DUDAS
*Acting Director of the United States Patent and Trademark Office*